United States Patent
Cao et al.

(10) Patent No.: US 10,651,205 B2
(45) Date of Patent: May 12, 2020

(54) ARRAY SUBSTRATE, DISPLAY PANEL AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Ke Cao, Beijing (CN); Chengshao Yang, Beijing (CN); Wenlong Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/951,466

(22) Filed: Apr. 12, 2018

(65) Prior Publication Data

US 2018/0374874 A1  Dec. 27, 2018

Related U.S. Application Data

(63) Continuation-in-part of application No. PCT/CN2017/102758, filed on Sep. 21, 2017.

(30) Foreign Application Priority Data

Feb. 8, 2017 (CN) .......................... 2017 1 0068945

(51) Int. Cl.
*H04L 27/12* (2006.01)
*H01L 27/12* (2006.01)
(Continued)

(52) U.S. Cl.
CPC .......... *H01L 27/124* (2013.01); *G02F 1/1368* (2013.01); *G02F 1/13624* (2013.01);
(Continued)

(58) Field of Classification Search
CPC ............... H01L 27/124; H01L 23/3171; H01L 27/1288; G02F 1/136286; G02F 1/1368
See application file for complete search history.

(56) References Cited

U.S. PATENT DOCUMENTS

2003/0144504 A1*  7/2003  Fischer ................ C07D 207/38
544/54
2009/0147999 A1   6/2009  Maeda et al.
(Continued)

FOREIGN PATENT DOCUMENTS

| CN | 103367353 A | 10/2013 |
| CN | 103730485 A | 4/2014 |

(Continued)

OTHER PUBLICATIONS

Dec. 6, 2017—(WO) International Search Report and Written Opinion Appl PCT/CN2017/102758 with English Translation.

*Primary Examiner* — Dung A. Le
(74) *Attorney, Agent, or Firm* — Banner & Witcoff, Ltd.

(57) ABSTRACT

An array substrate and a display device are provided. The array substrate includes a base substrate; a first active layer, located on the base substrate; a first insulating layer, located on the first active layer and the base substrate; a gate electrode, located at a side of the first insulating layer away from the first active layer; a second insulating layer, located on the gate electrode and the first insulating layer; a second active layer, located on the second insulating layer away from the gate electrode; a first drain electrode and a first source electrode, being in partial contact with the first active layer, respectively; a second drain electrode and a second source electrode, being in partial contact with the second active layer, respectively; and a pixel electrode, the first drain electrode and the second drain electrode are electrically connected, the first source electrode and the second source electrode are electrically connected, and the pixel (Continued)

electrode is electrically connected with at least one of the first drain electrode and the second drain electrode. The array substrate can improve the responding speed and charging efficiency, and avoid increasing the aperture opening ratio at the same time.

13 Claims, 10 Drawing Sheets

(51) Int. Cl.
*G02F 1/1362* (2006.01)
*G02F 1/1368* (2006.01)
*H01L 23/31* (2006.01)
*H01L 29/417* (2006.01)
*H01L 29/786* (2006.01)
*H01L 21/84* (2006.01)
*G02F 1/1343* (2006.01)

(52) U.S. Cl.
CPC ........ *G02F 1/136286* (2013.01); *H01L 21/84* (2013.01); *H01L 23/3171* (2013.01); *H01L 27/127* (2013.01); *H01L 27/1222* (2013.01); *H01L 27/1288* (2013.01); *H01L 29/41733* (2013.01); *H01L 29/78696* (2013.01); *G02F 1/136227* (2013.01); *G02F 2001/13685* (2013.01); *G02F 2001/134372* (2013.01); *G02F 2201/121* (2013.01); *G02F 2201/123* (2013.01)

(56) References Cited

U.S. PATENT DOCUMENTS

| | | |
|---|---|---|
| 2013/0240886 A1 | 9/2013 | Yeh et al. |
| 2015/0144905 A1 | 5/2015 | Kim et al. |
| 2016/0013326 A1* | 1/2016 | Sun ................. G02F 1/1368 257/71 |
| 2016/0020263 A1 | 1/2016 | Xu et al. |
| 2016/0079285 A1 | 3/2016 | Chiang et al. |

FOREIGN PATENT DOCUMENTS

| | | |
|---|---|---|
| CN | 104659057 A | 5/2015 |
| CN | 105720056 A | 6/2016 |
| TW | 201338102 A | 9/2013 |

* cited by examiner

ARRAY SUBSTRATE, DISPLAY PANEL AND DISPLAY DEVICE

CROSS-REFERENCE TO RELATED APPLICATIONS

This application is a continuation-in-part of PCT Application No. PCT/CN2017/102758 filed on Sep. 21, 2017, and entitled "Array Substrate, Display Panel and Display Device", which claims priority to and the benefit of Chinese Patent Application No. 201710068945.0, filed on Feb. 8, 2017, and entitled "Array Substrate, Display Panel and Display Device". The above-mentioned applications are incorporated herein by reference in their entirety and for all purposes.

TECHNICAL FIELD

Embodiments of the present disclosure relate to an array substrate, a display panel and a display device.

BACKGROUND

With the continuous development of display device field, thin film transistor liquid crystal display device (TFT-LCD) has been the mainstream of display device due to its advantages such as: fast responding speed, high integration level, lower power consumption, light weight and thin thickness. TFT-LCD generally includes a liquid crystal cell cell-assembled by an array substrate having a thin film transistor (TFT) array and an opposed substrate, and a liquid crystal molecule layer filled in the liquid crystal cell.

At present, with the continuous development of the resolution ratio and increase of size of TFT-LCD, it is required that the TFT-LCD must have faster responding speed and higher charging efficiency.

SUMMARY

At least one embodiment of the present disclosure provides an array substrate, comprising: a base substrate; a first active layer, located on the base substrate; a first insulating layer, located on the first active layer and the base substrate; a gate electrode, located at a side of the first insulating layer away from the first active layer; a second insulating layer, located on the gate electrode and the first insulating layer; a second active layer, located at a side of the second insulating layer away from the gate electrode; a first drain electrode and a first source electrode, being in partial contact with the first active layer, respectively; a second drain electrode and a second source electrode, being in partial contact with the second active layer, respectively; and a pixel electrode, wherein the first drain electrode and the second drain electrode are electrically connected, the first source electrode and the second source electrode are electrically connected, and the pixel electrode is electrically connected with at least one of the first drain electrode and the second drain electrode.

In some examples, an orthographic projection of the gate electrode on the base substrate falls into an orthographic projection of the first active layer and the second active layer on the base substrate.

In some examples, the array substrate further comprises: a first via hole, located in the first insulating layer and the second insulating layer and partially exposing the first drain electrode, a part of the second drain electrode penetrates through the first via hole to reach the first drain electrode so that the second drain electrode and the first drain electrode are electrically connected with each other.

In some examples, the array substrate further comprises: a second via hole, located in the first insulating layer and the second insulating layer and partially exposing the first source electrode, a part of the second source electrode penetrates through the second via hole to reach the first source electrode so that the second source electrode and the first source electrode are electrically connected with each other.

In some examples, the array substrate further comprises: a passivation layer, located at a side of the second drain electrode and the second source electrode away from the second active layer, wherein the pixel electrode is located between the second drain electrode and the passivation layer and is in partial contact with the second drain electrode.

In some examples, the array substrate further comprises: a common electrode at a side of the passivation layer away from the base substrate; a common electrode line in the same layer as the gate electrode, wherein a part of the common electrode penetrates a via hole in the passivation layer and the second insulating layer to reach the common electrode line so that the common electrode and the common electrode line are electrically connected with each other, and the common electrode and the pixel electrode are at least partially overlapped with each other in a direction perpendicular to the base substrate.

In some examples, the array substrate further comprises: a passivation layer, located at a side of the second drain electrode and the second source electrode away from the second active layer; a third via hole, located in the first insulating layer, the second insulating layer, the second drain electrode and the passivation layer and partially exposing the first drain electrode; and a first conductive structure, located in the third via hole to electrically connect the first drain electrode and the second drain electrode.

In some examples, the array substrate further comprises: a fourth via hole, located in the first insulating layer, the second insulating layer, the second source electrode and the passivation layer and partially exposing the first source electrode; and a second conductive structure, located in the fourth via hole to electrically connect the first source electrode and the second source electrode.

In some examples, the pixel electrode is located between the second drain electrode and the passivation layer and is in partial contact with the second drain electrode.

In some examples, the array substrate further comprises: a fifth via hole, located in the passivation layer and partially exposing a portion of the pixel electrode being in contact with the second drain electrode, the first conductive structure is further located in the fifth via hole.

In some examples, the pixel electrode comprises the first conductive structure.

In some examples, the array substrate further comprises: a sixth via hole, located in the passivation layer and partially exposing the second source electrode, and the second conductive structure is further located in the sixth via hole.

At least one embodiment of the present disclosure provides a display panel, which includes any one of the above-mentioned array substrate.

At least one embodiment of the present disclosure provides a display device, which includes the display panel as mentioned above.

At least one embodiment of the present disclosure provides a manufacturing method of an array substrate, which includes: forming a first active layer on a base substrate; forming a first drain electrode and a first source electrode on the base substrate, the first drain electrode and the first source electrode being in partial contact with the first active layer, respectively; forming a first insulating layer at a side of the first active layer, the first source electrode and the first drain electrode away from the base substrate; forming a gate electrode at a side of the first insulating layer away from the first active layer; forming a second insulating layer at a side of the gate electrode away from the first insulating layer; forming a second active layer at a side of the second insulating layer away from the gate electrode; forming a second drain electrode and a second source electrode at a side of the second insulating layer away from the gate electrode to be in partial contact with the second active layer; and forming a pixel electrode, the first source electrode and the second source electrode are electrically connected, the first drain electrode and the second drain electrode are electrically connected, the pixel electrode is electrically connected with at least one of the first drain electrode and the second drain electrode.

For example, in the manufacturing method of the array substrate provided by an embodiment of the present disclosure, after forming a second active layer at a side of the second insulating layer away from the gate electrode, the manufacturing method includes: etching the first insulating layer and the second insulating layer to form a first via hole partially exposing the first source electrode and a second via hole partially exposing the first drain electrode, the second source electrode is connected with the first source electrode through the first via hole, the second drain electrode is connected with the first drain electrode through the second via hole.

For example, in the manufacturing method of the array substrate provided by an embodiment of the present disclosure, forming the second active layer at a side of the second insulating layer away from the gate electrode includes: forming a second semiconductor layer at a side of the second insulating layer away from the gate electrode; and patterning the second semiconductor layer to form the second active layer, patterning the second semiconductor layer to form the second active layer and etching the first insulating layer and the second insulating layer to form the first via hole and the second via hole are formed through a mask process.

For example, in the manufacturing method of the array substrate provided by an embodiment of the present disclosure, after forming the pixel electrode, the manufacturing method further includes: forming a passivation layer at a side of the pixel electrode away from the base substrate, the passivation layer is disposed at a side of the second drain electrode and the second source electrode away from the second active layer.

For example, the manufacturing method of the array substrate provided by an embodiment of the present disclosure further includes: forming a common electrode at a side of the passivation layer away from the base substrate.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used in the present disclosure have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "includes", "comprising", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
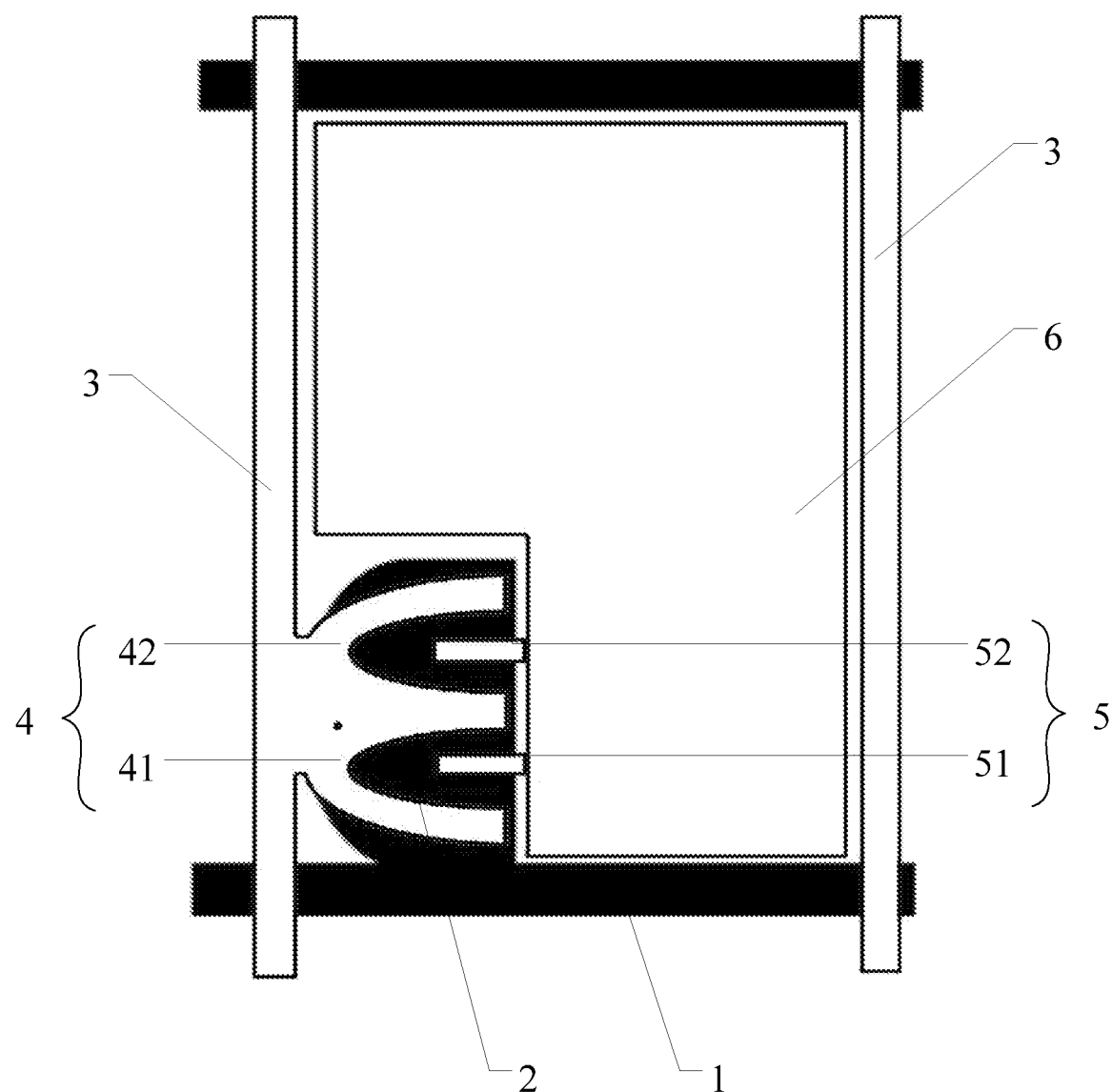
FIG. 1 is a plan schematic diagram of an array substrate.

In order to allow a TFT-LCD to have a faster responding speed and a higher charging efficiency, a dual thin film transistor (Dual-TFT) structure is widely applied. As illustrated by FIG. 1, a Dual-TFT structure includes a gate line 1, a gate electrode 2 electrically connected with the gate line 1, a data line 3, a source electrode 4 electrically connected with the data line 3, a drain electrode 5, and a pixel electrode 6 electrically connected with the drain electrode 5. The source electrode 4 includes a first source electrode 41 and a second source electrode 42, the drain electrode 5 includes a drain electrode 51 and a second drain electrode 52, the first source electrode 41 and the first drain electrode 51 are disposed opposite to each other, the second source electrode 42 and the second drain electrode 52 are disposed opposite to each other, the first source electrode 41, the second source electrode 42, the first drain electrode 51 and the second drain electrode 52 share the gate electrode 2. Although this Dual-TFT structure improves the responding speed and charging efficiency, this Dual-TFT structure increases area occupied by thin film transistor switches and reduces the aperture opening ratio.

Embodiments of the present disclosure provide an array substrate, a manufacturing method thereof, and a display device. The array substrate includes a base substrate, a first active layer located on the base substrate, a first insulating layer located on the first active layer and the base substrate, a gate electrode located at a side of the first insulating layer away from the first active layer, a second insulating layer located on the gate electrode and the first insulating layer, a second active layer located at a side of the second insulating layer away from the gate electrode, a first drain electrode and a first source electrode being in partial contact with the first active layer, respectively, a second drain electrode and a second source electrode being in partial contact with the second active layer, and a pixel electrode. The first source electrode and the second source electrode are electrically connected, the first drain electrode and the second drain electrode are electrically connected, the pixel electrode is electrically connected with at least one of the first drain electrode and the second drain electrode. Thus, the array substrate can improve the responding speed and the charging efficiency, without increasing area occupied by thin film transistor switches and reducing the aperture opening ratio.

Hereinafter, the array substrate, the manufacturing method thereof, and the display device provided by embodiments of the present disclosure will be described with reference to the accompanying drawings.

Figure 2A:
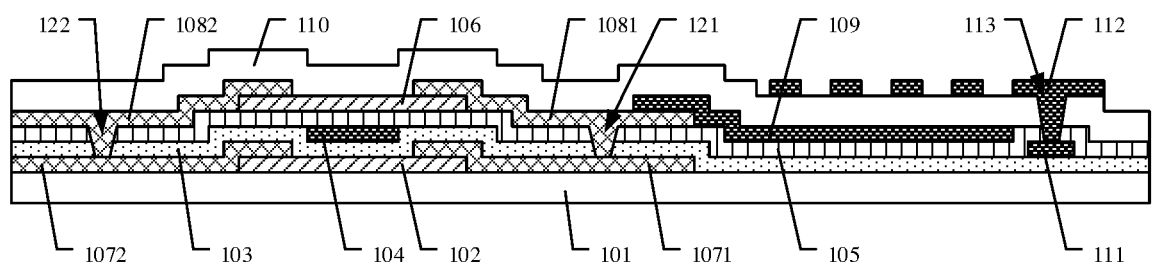
FIGS. 2a and 2b are sectional schematic diagrams of array substrates provided by embodiments of the present disclosure.

An embodiment of the present disclosure provides an array substrate. FIG. 2a illustrates a sectional schematic diagram of an array substrate. As illustrated by FIG. 2a, the array substrate includes a base substrate 101, a first active layer 102 located on the base substrate 101, a first insulating layer 103 located on the first active layer 102 and the base substrate 101, a gate electrode 104 located at a side of the first insulating layer 103 away from the first active layer 102, a second insulating layer 105 located on the gate electrode 104 and the first insulating layer 103, a second active layer 106 located at a side of the second insulating layer 105 away from the gate electrode 104, a first drain electrode 1071 and a first source electrode 1072 being in partial contact with the first active layer 102, respectively, a second drain electrode 1081 and a second source electrode 1082 being in partial contact with the second active layer 106, and a pixel electrode 109. The first source electrode 1072 and the second source electrode 1082 are electrically connected, the first drain electrode 1071 and the second drain electrode 1081 are electrically connected, and the pixel electrode 109 is electrically connected with at least one of the first drain electrode 1071 and the second drain electrode 1081. A region of the first active layer 102 contacting the first source electrode 1072 is a source electrode region, a region of the first active layer 102 contacting the first drain electrode 1071 is a drain electrode region, and a region of the first active layer 102 between the source electrode region and the drain electrode region is a channel region; a region of the second active layer 106 contacting the second source electrode 1082 is a source electrode region, a region of the second active layer 106 contacting the second drain electrode 1081 is a drain electrode region, and a region of the second active layer 106 between the source electrode region and the drain electrode region is a channel region.

Figure 3:
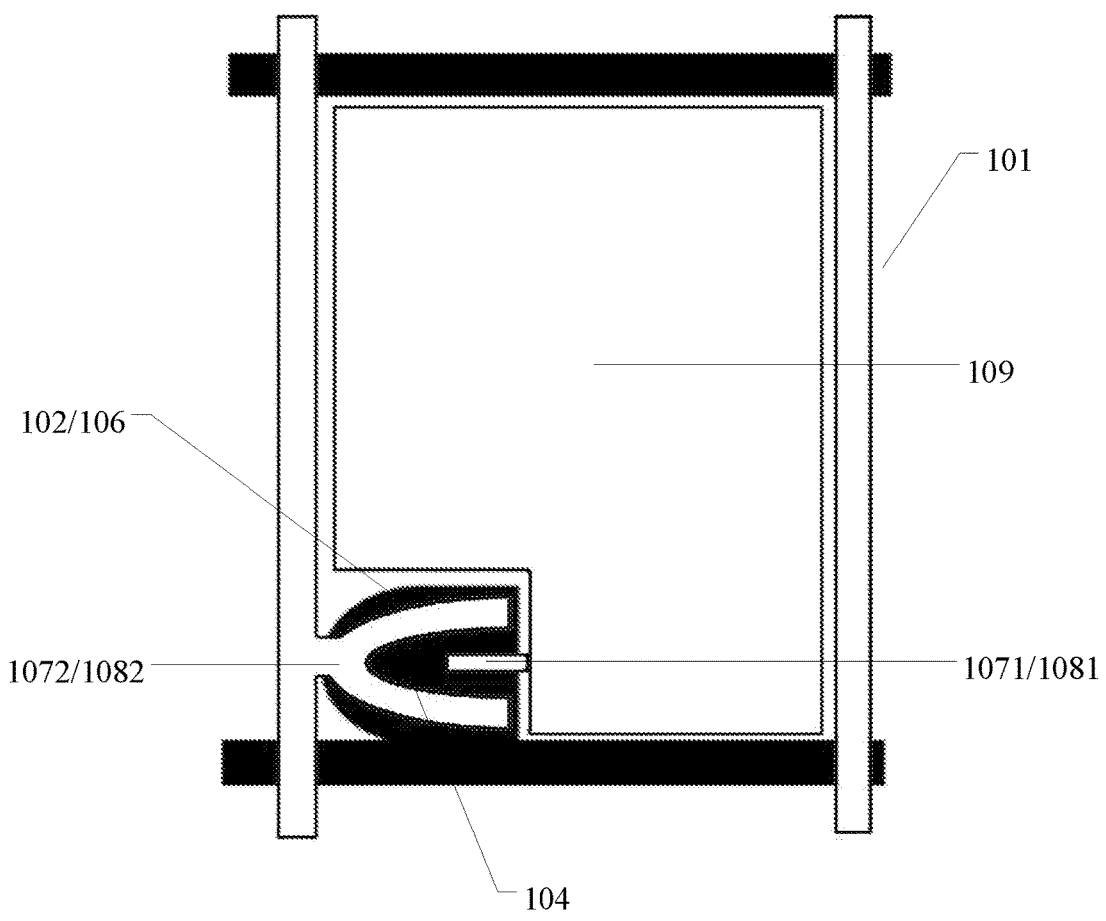
FIG. 3 is a plan schematic diagram of an array substrate provided by an embodiment of the present disclosure.

In the array substrate provided by the present embodiment, the first source electrode and the second source electrode are electrically connected, the first drain electrode and the second drain electrode are electrically connected, the pixel electrode can be connected to at least one of the first drain electrode and the second drain electrode so that the pixel electrode can obtain an electrical signal from the first and second drain electrodes. The gate electrode can simultaneously control the channel regions of the first active layer and the second active layer. Thus, the array substrate can improve the responding speed and charging efficiency. For example, an electrical signal can enter from the first source electrode, be spread to the second source electrode, and be transferred to the first drain electrode and the second drain electrode through the channel regions of the first active layer and the second active layer, so as to utilize a single gate electrode to control two channels, thereby avoiding a delay. Besides, because the second active layer, the second drain electrode and the second source electrode are located on the first active layer, the first drain electrode, and the first source electrode, the array substrate does not increase the area occupied by thin film transistor switches and reduce the aperture opening ratio. For example, FIG. 3 is a top view of the array substrate, as illustrated by FIG. 3, orthographic projections of the second active layer, the second drain electrode and the second source electrode on the base substrate are overlapped with the orthographic projections of the first active layer, the first drain electrode and the first source electrode on the base substrate, so that the array substrate does not increase the area occupied by thin film transistor switches and reduce the aperture opening ratio.

For example, in some examples, as illustrated by FIG. 2a, the first drain electrode 1071 and the first source electrode 1072 are respectively lapped on the first active layer 102; the second drain electrode 1081 and the second source electrode 1082 are respectively lapped on the second active layer 106.

For example, in some examples, as illustrated by FIG. 2a, a distance between the first drain electrode 1071 and the base substrate 101 is smaller than a distance between the second drain electrode 1081 and the base substrate 101, and a distance between the first source electrode 1072 and the base substrate 101 is smaller than a distance between the second source electrode 1082 and the base substrate 101; for example, other layer structures can be arranged between the first drain electrode 1071 and the second drain electrode 1081, for example, a first insulating layer 103 and a second insulating layer 105. Similarly, there are other layer structures located between the first source electrode 1072 and the second source electrode 1082, for example, a first insulating layer 103 and a second insulating layer 105.

For example, in some embodiments of the disclosure, as illustrated by FIG. 2a, an orthographic projection of the gate electrode 104 on the base substrate 101 falls into an orthographic projection of the first active layer 102 and the second active layer 106 on the base substrate 101. For example, the gate electrode 104 is disposed corresponding to the channel region of the first active layer 102 and the channel region of the second active layer 106. Thus, the gate electrode can control the channel regions of the first active layer and the second active layer.

For example, in the array substrate provided by an example of the present embodiment, as illustrated by FIG. 2a, the array substrate further includes a first via hole 121 located in the first insulating layer 103 and the second insulating layer 105 and partially exposing the first drain electrode 1071, a part of the second drain electrode 1081 penetrates through the first via hole 121 to reach the first drain electrode 1071 so that the second drain electrode 1081 and the first drain electrode 1071 are electrically connected with each other.

For example, in the array substrate provided by an example of the present embodiment, as illustrated by FIG. 2a, the array substrate further includes a second via hole 122 located in the first insulating layer 103 and the second insulating layer 105 and partially exposing the first source electrode 1072, a part of the second source electrode 1082 penetrates through the via hole 122 to reach the first source electrode 1072 so that the second source electrode 1082 and the first source electrode 1072 are electrically connected with each other.

For example, in the array substrate provided by an example of the present embodiment, as illustrated by FIG. 2*a*, the array substrate further includes a passivation layer 110 located at a side of the second drain electrode 1081 and the second source electrode 1082 away from the second active layer 106, the pixel electrode 109 is located between the second drain electrode 1081 and the passivation layer 110, and is in partial contact with the second drain electrode 1081. For example, as illustrated by FIG. 2*a*, the pixel electrode 109 can be lapped on the second drain electrode 1081. Thus, the array substrate does not use a via hole to connect the pixel electrode and the second drain electrode, so as to simplify the structure of the array substrate and improve the stability. For example, the embodiments of the present disclosure comprise but are not limited thereto, the pixel electrode can be disposed on the passivation layer and a part of the pixel electrode penetrates through a via hole in the passivation layer to reach the second drain electrode so that the pixel electrode and the second drain electrode can be electrically connected with each other.

For example, in the array substrate provided by an example of the present embodiment, as illustrated by FIG. 2*a*, the array substrate further includes a common electrode line 111, located in a same layer with the gate electrode 104. Alternatively, the common electrode line can be disposed in other layers, and the embodiments of the present disclosure are not limited thereto.

Figure 2B:
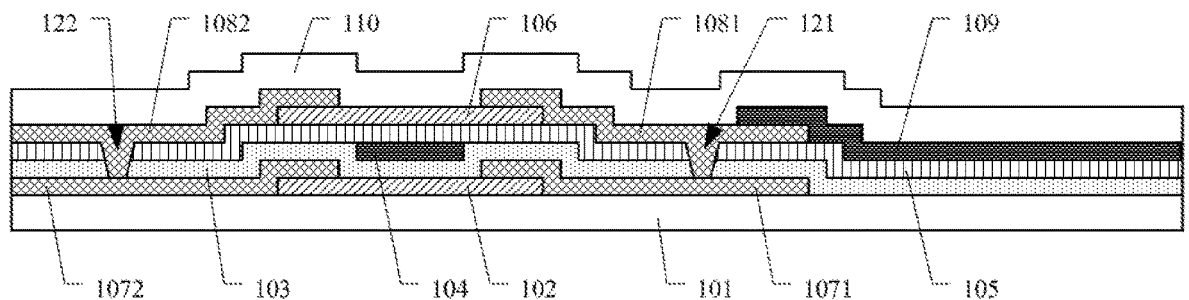

For example, in the array substrate provided by an example of the present embodiment, as illustrated by FIG. 2*a*, the array substrate further includes a common electrode 112, located on the passivation layer 110. A part of the common electrode 112 penetrates through the via hole 113 to reach the common electrode line so that the common electrode 112 and the common electrode line 111 are electrically connected with each other. However, the embodiments of the disclosure are not limited thereto. In another example, as illustrated by FIG. 2*b*, a TN structure is illustrated, and the difference between the array substrate in FIG. 2*a* and the array substrate in FIG. 2*b* lies in that the common electrode 112, the common electrode line 111, and the corresponding via hole 113 are omitted in the structure illustrated in FIG. 2*b*.

Figure 4A:
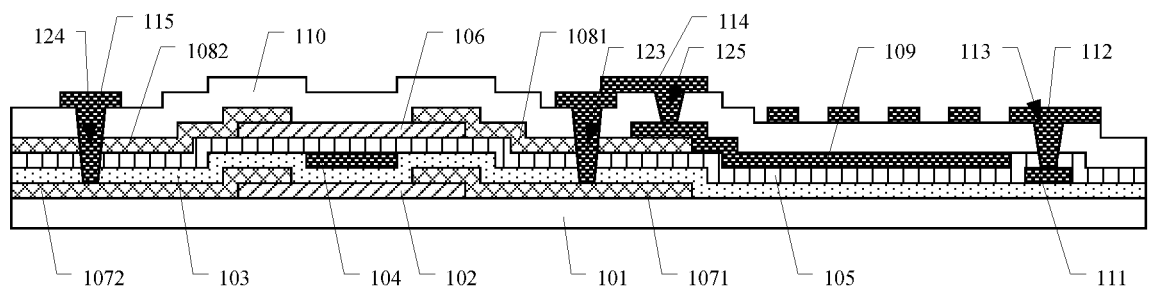
FIG. 4a-4d are sectional schematic diagrams of array substrates provided by embodiments of the present disclosure.

An embodiment of the present disclosure provides an array substrate. FIG. 4*a* illustrates a sectional schematic diagram of another array substrate. As illustrated by FIG. 4*a*, the array substrate further includes a passivation layer 110, the passivation layer 110 is disposed at a side of the second drain electrode 1081 and the second source electrode 1082 away from the second active layer 106. What is different from the array substrate provided by the embodiment illustrated in FIG. 2*a* is the connection manners between the first and second source electrodes and between the first and second drain electrode. In the present embodiment, the array substrate includes a third via hole 123 located in the first insulating layer 103, a second insulating layer 105, the second drain electrode 1081 and the passivation layer 110 and partially exposing the first drain electrode 1071, and a first conductive structure 114 located in the third via hole 123 to electrically connect the first drain electrode 1071 and the second drain electrode 1081. Thus, the first drain electrode 1071 and the second drain electrode 1081 are electrically connected through the first conductive structure 114 and the third via hole 123.

For example, in the array substrate provided by an example of the present embodiment, as illustrated by FIG. 4*a*, the array substrate further includes a fourth via hole 124 located in the first insulating layer 103, the second insulating layer 105, the second source electrode 1082 and the passivation layer 110 and partially exposing the first source electrode 1072, and a second conductive structure 115 located in the fourth via hole 124 to electrically connect the first source electrode 1072 and the second source electrode 1082. Thus, the first source electrode 1072 and the second source electrode 1082 are electrically connected through the second conductive structure 115 and the fourth via hole 124.

For example, as illustrated by FIG. 4*a*, the array substrate includes a common electrode line 111 and a common electrode 112. A part of the common electrode 112 penetrates through the via hole 113 to each the common electrode line 111 so that the common electrode 112 and the common electrode line 111 are electrically connected with each other. At this time, the third via hole 123 and/or the fourth via hole 124 and the via hole 113 can be formed through one mask process, so as to save processes and save the costs.

For example, in the array substrate provided by an example of the present embodiment, as illustrated by FIG. 4*a*, the pixel electrode 109 is disposed between the second drain electrode 1081 and the passivation layer 110 and is in partial contact with the second drain electrode 1081, so as to be electrically connected with the second drain electrode 1081. For example, as illustrated by FIG. 4*a*, the pixel electrode 109 can be lapped on the second drain electrode 1081. Thus, the array substrate does not use a via hole to connect the pixel electrode and the second drain electrode, so as to be able to simplify the structure of the array substrate, and improve the stability. For example, the embodiments of the present disclosure comprise but are not limited thereto, and the pixel electrode can be disposed on the passivation layer and a part of the pixel electrode penetrates through a via hole in the passivation layer to reach the second drain electrode so that the pixel electrode and the second drain electrode can be electrically connected with each other.

For example, in the array substrate provided by an example of the present embodiment, as illustrated by FIG. 4*a*, the array substrate further includes a fifth via hole 125 located in the passivation layer 110 and partially exposing a portion of the pixel electrode 109 contacting the second drain electrode 1081, and the first conductive structure 114 is further disposed in the fifth via hole 125. Thus, the stability of the electrical connection of the pixel electrode and the second drain electrode can be further improved.

Figure 4B:
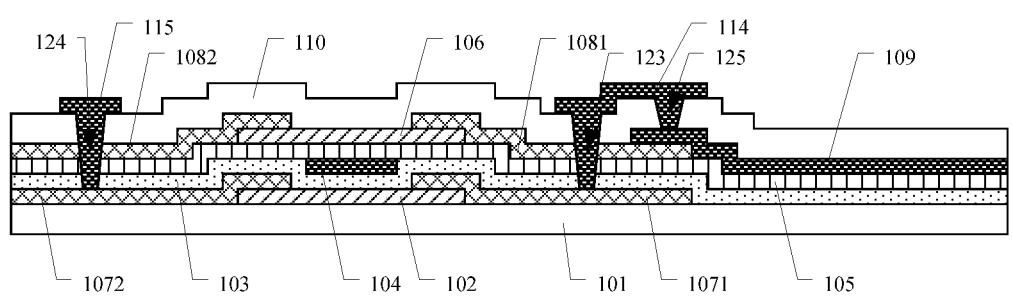

For example, in the array substrate provided by an example of the present embodiment, as illustrated by FIG. 4*a*, the pixel electrode 109 includes a first conductive structure 114, for example, the first conductive structure 114 can be a part of the pixel electrode 109. For example, as illustrated by FIG. 4*b*, in some embodiments, the array substrate adopts a TN structure, i.e., the array substrate being only provided with a pixel electrode. In these embodiments of TN structure, the pixel electrode includes a first conductive structure, which can increase the stability and reliability of the connection of the pixel electrode and the first drain electrode and the second drain electrode, and can further increase the aperture opening ratio.

Figure 4C:
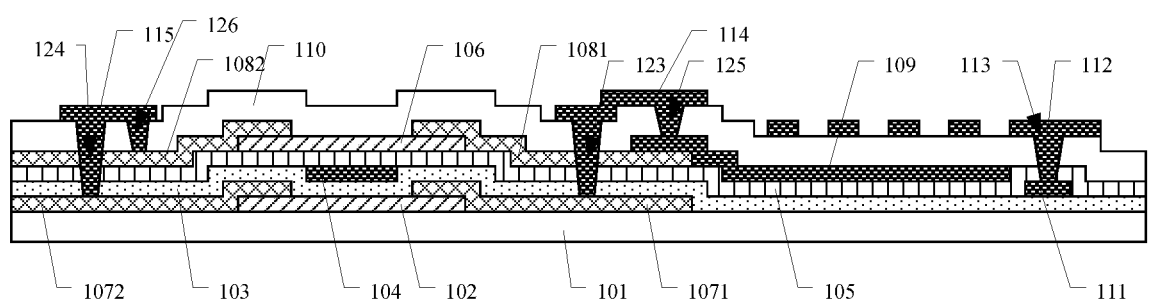
Figure 4D:
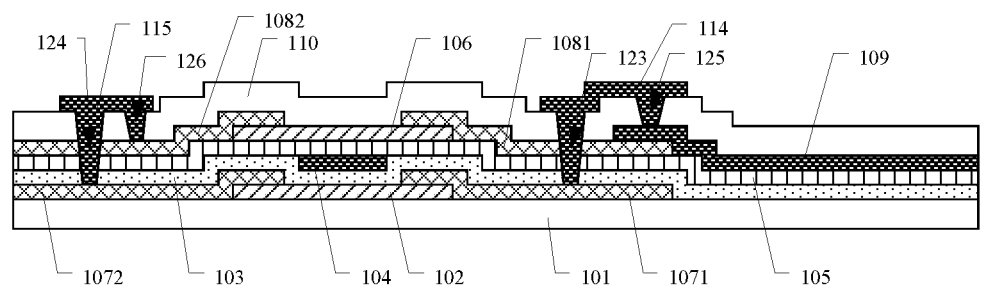

FIGS. 4*c* and 4*d* are schematic diagrams of array substrate in some embodiments of the disclosure. The difference between the structure in FIG. 4*c* and the structure in FIG. 4*a* lies in that a sixth via hole 126 is formed in the passivation layer 110, and the second conductive structure 115 is further disposed in the sixth via hole 126. Thus, the first and second source electrodes 1072 and 1082 can be electrically connected with each other through the second conductive structure 115. Similarly, the difference between the structure in FIG. 4d and the structure in FIG. 4b lies in that a sixth via hole 126 is formed in the passivation layer 110, and the second conductive structure 115 is further disposed in the sixth via hole 126. Thus, the first and second source electrodes 1072 and 1082 can be electrically connected with each other through the second conductive structure 115.

An embodiment of the present disclosure provides a display panel, which includes the array substrate according to any one of the abovementioned embodiments. Thus, the display device has favorable effects corresponding to the favorable effects of the array substrate according to any one of the abovementioned embodiments, the favorable effects can refer to the relevant descriptions in the abovementioned embodiments for details, and the repeated portions are omitted herein. Besides, because the display device has a relatively fast responding speed and a relatively fast charging efficiency, the display device can be applied to a display device with a large size, such as a television and a stage screen. An embodiment of the present disclosure provides a display device, which includes the display panel as mentioned above.

Figure 5:
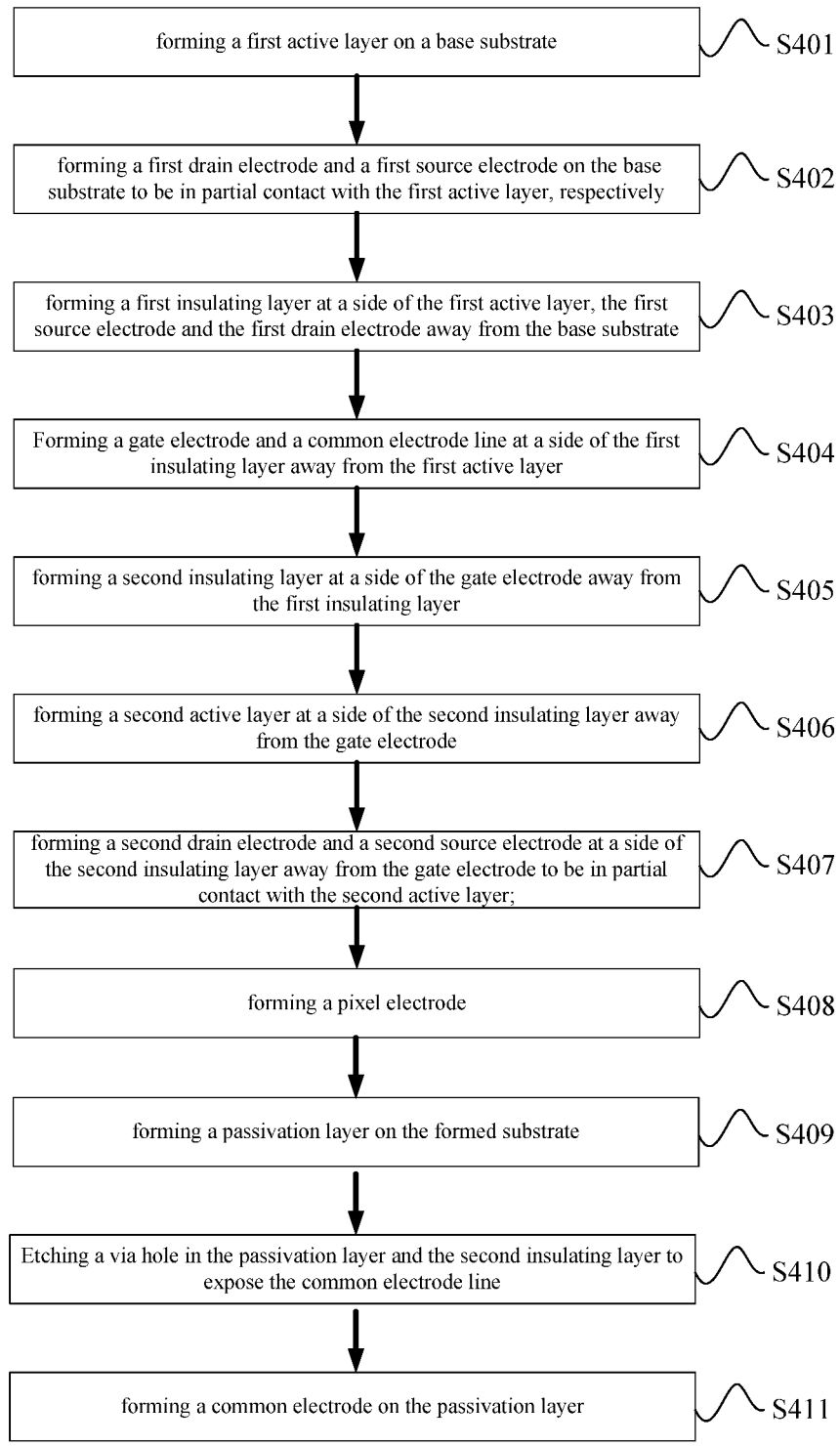
FIG. 5 is a flow schematic diagram of a manufacturing method of an array substrate provided by an embodiment of the present disclosure.

An embodiment of the present disclosure provides a manufacturing method of an array substrate, as illustrated by FIG. 5, the manufacturing method of the array substrate includes the following steps S401-S411.

Figure 6A:
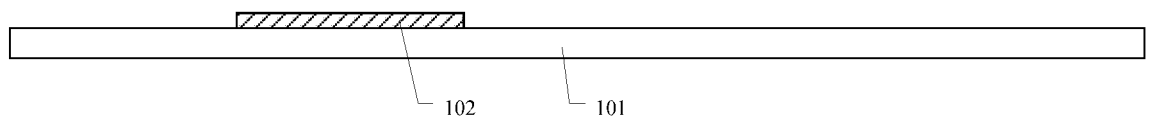
FIGS. 6a-6l are step-by-step schematic diagrams of a manufacturing method of an array substrate provided by an embodiment of the present disclosure.

Step S401: as illustrated by FIG. 6a, forming a first active layer 102 on a base substrate 101.

For example, the base substrate can be selected as a glass substrate, a quartz substrate, and a plastic substrate; the material of the first active layer can adopt oxide semiconductor, amorphous silicon, poly-silicon and so on. In addition, the embodiments of the present disclosure comprise but are not limited thereto.

Figure 6B:
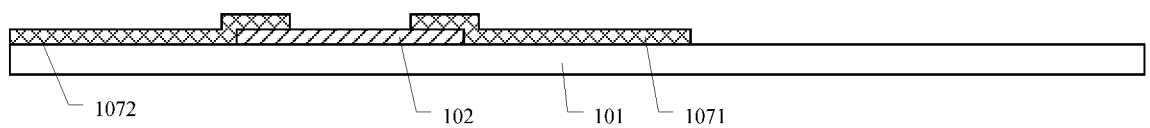

Step S402: as illustrated by FIG. 6b, forming a first drain electrode 1071 and a first source electrode 1072 on a base substrate 101 to be in partial contact with the first active layer 102.

For example, as illustrated by FIG. 6b, the first drain electrode 1071 and the first source electrode 1072 are respectively lapped at two sides of the first active layer 102, i.e., a source electrode region and a drain electrode region of the first active layer 102. Besides, as illustrated by FIG. 6b, the first drain electrode 1071 and the first source electrode 1072 are disposed at a side of the first active layer 102 away from the base substrate 101. For example, the first drain electrode 1071 and the first source electrode 1072 can also be disposed at a side of the first active layer 102 close to the base substrate, and the embodiments of the present disclosure are not limited thereto.

Figure 6C:
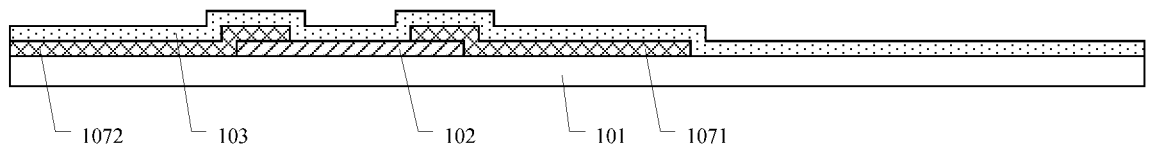

Step S403: as illustrated by FIG. 6c, forming a first insulating layer 103 at a side of the first active layer 102, the first source electrode 1072, and a first drain electrode 1071 away from the base substrate 101.

For example, the material of the first insulating layer can adopt an organic insulating material or an inorganic insulating material, and the embodiments of the present disclosure are not limited thereto.

Figure 6D:
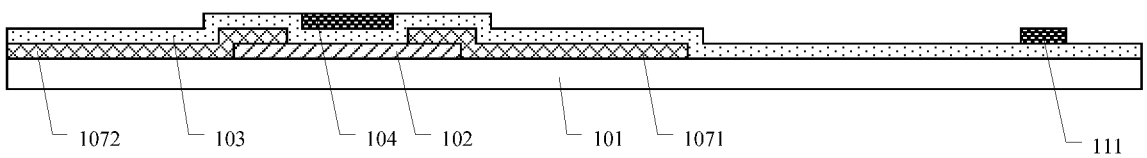

Step S404: as illustrated by FIG. 6d, forming a gate electrode 104 and a common electrode line 111 at a side of the first insulating layer 103 away from the first active layer 102.

For example, the material of the gate electrode can be one or more selected from a group consisting of aluminum, aluminum alloy, copper, copper alloy, molybdenum, and molybdenum alloy. For example, the common electrode line 111 and the gate electrode 104 are formed in a same layer. For example, the common electrode line can be formed in the other layer, and the embodiments of the present disclosure are not limited thereto.

Figure 6E:
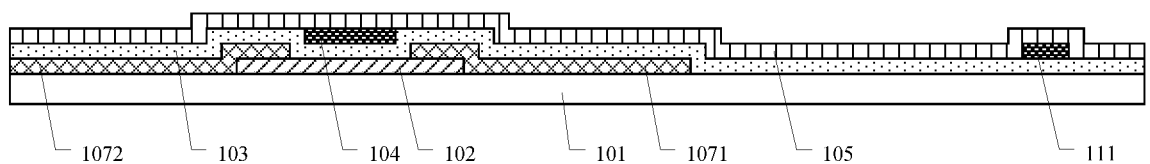

Step S405: as illustrated by FIG. 6e, forming a second insulating layer 105 at a side of the gate electrode 104 away from the first insulating layer 103.

For example, the material of the second insulating layer can adopt an organic insulating material or an inorganic insulating layer, and the embodiments of the present disclosure are not limited thereto.

Figure 6F:
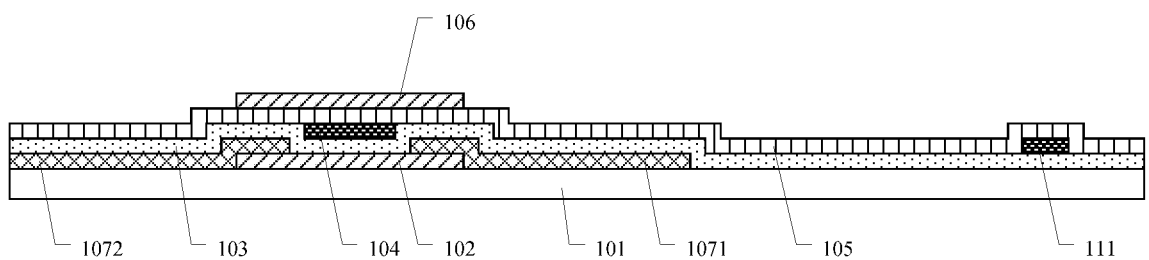

Step S406: as illustrated by FIG. 6f, forming a second active layer 106 at a side of the second insulating layer 105 away from the gate electrode 104.

For example, the material of the second active layer can adopt oxide semiconductor, amorphous silicon, poly-silicon, or the like; in addition, the embodiments of the present disclosure comprise are not limited thereto.

Figure 6G:
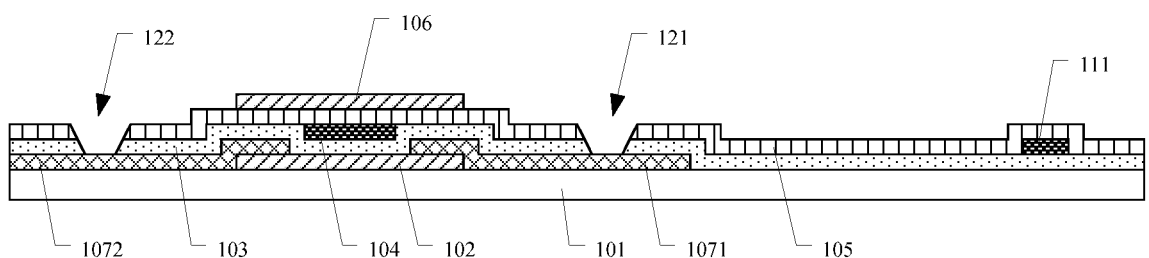
Figure 6H:
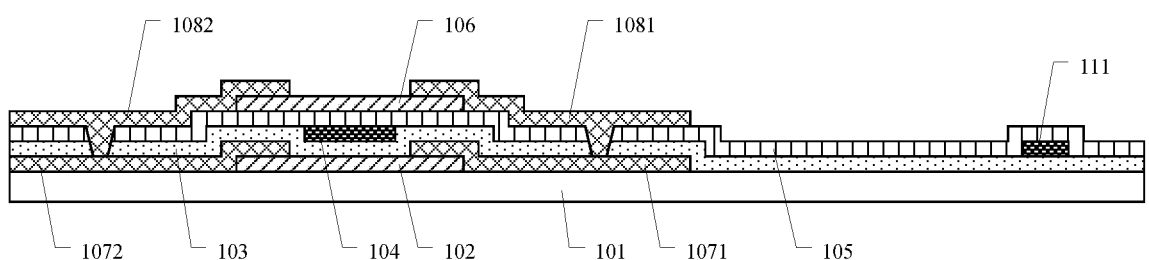

Step S407: as illustrated by FIGS. 6g and 6h, forming a second drain electrode 1081 and a second source electrode 1082 at a side of the second insulating layer 105 away from the gate electrode 104 to be in partial contact with the second active layer 106.

For example, as illustrated by FIG. 6h, a part of the second drain electrode 1081 penetrates through the via hole 121 to reach the first drain electrode 1071 so that the second drain electrode 1081 and the first drain electrode 1071 are electrically connected with each other; a part of the second source electrode 1082 penetrates through the via hole 122 to reach the first source electrode 1072 so that the second source electrode 1082 and the first source electrode 1072 are electrically connected with each other.

With regard to the via holes 121 and 122 for connecting the drain electrodes and the source electrodes, as shown in FIG. 6g, they can be formed before forming the second drain electrode 1081 and the second source electrode 1082.

In some examples, after step S406, i.e., after forming the second active layer at a side of the second insulating layer away from the gate electrode, etching the first insulating layer 103 and the second insulating layer 105 to form a first via hole 121 partially exposing the first source electrode 1072 and a second via hole 122 partially exposing the first drain electrode 1071. A part of the second drain electrode 1081 penetrates through the via hole 121 to reach the first drain electrode 1071 so that the second drain electrode 1081 and the first drain electrode 1071 are electrically connected with each other; a part of the second source electrode 1082 penetrates through the via hole 122 to reach the first source electrode 1072 so that the second source electrode 1082 and the first source electrode 1072 are electrically connected with each other.

In some other examples, the formation of the via holes 121 and 122 can be in the same patterning process with the second active layer 106. For example, forming a second semiconductor layer at a side of the second insulating layer away from the gate electrode; and patterning the second semiconductor layer to from a second active layer, the step of patterning the second semiconductor layer to form the second active layer and the step of etching the first insulating layer and the second insulating layer to form the first via hole and the second via hole can be formed through one mask process. For example, using a half tone mask to form a photoresist layer with different thickness, and the photoresist layer expose the location for forming the via holes and has the thicker portion corresponding to the second active layer to be formed. Firstly, the first and second insulating layer are etched to form the via holes. Then, an ashing process is performed on the photoresist layer so as to only leave the thicker portion, and the second semiconductor layer is finally etched to form the second active layer. Thus, the processing steps can be saved, and the manufacturing costs can be reduced.

Figure 6I:
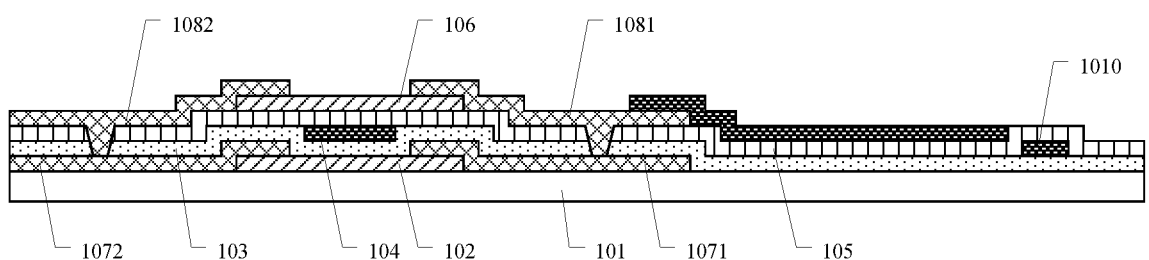

Step S408: as illustrated by FIG. 6i, forming a pixel electrode, the pixel electrode is electrically connected with at least one of the first drain electrode and the second drain electrode.

Figure 6J:
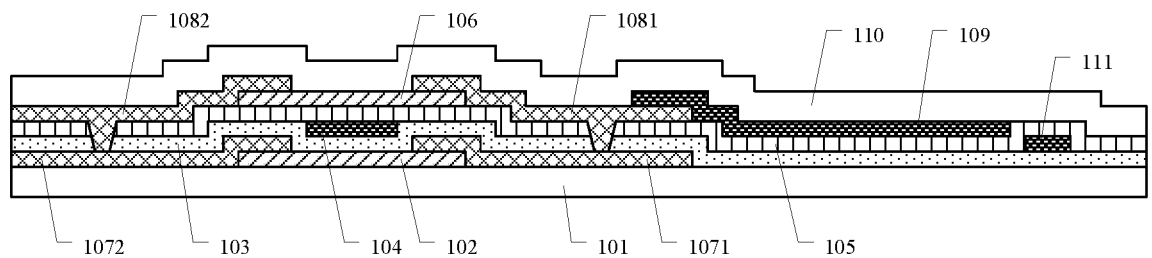

Step S409: after forming a pixel electrode 109, as illustrated by FIG. 6j, the manufacturing method further includes: forming a passivation layer 110 on the formed substrate.

Figure 6K:
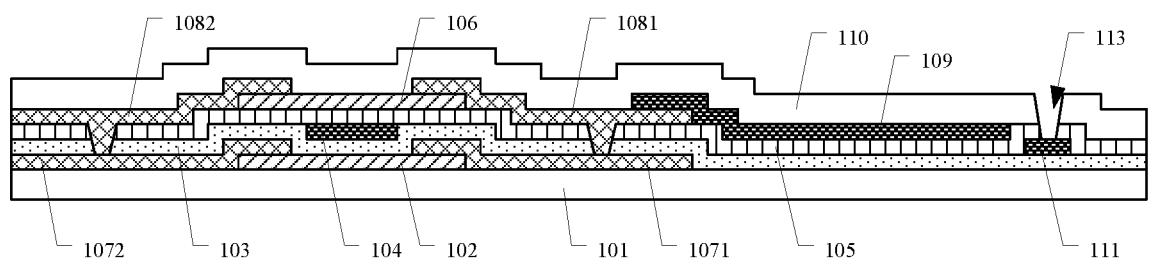

Step S410: as illustrated by FIG. 6k, etching a via hole 113 in the passivation layer 110 and the second insulating layer 105 to expose the common electrode line 111.

Figure 6L:
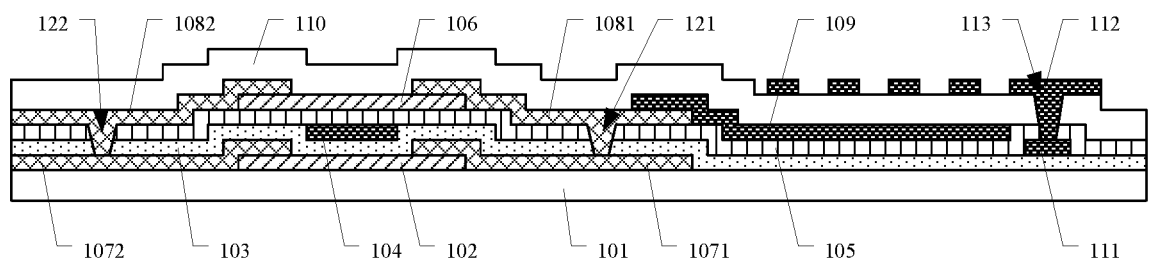

Step S411: as illustrated by FIG. 6l, the manufacturing method of the array substrate further includes forming a common electrode 112 on the passivation layer 110, a part of the common electrode 112 penetrates through the via hole 113 to reach the common electrode line so that the common electrode 112 and the common electrode line 111 are electrically connected with each other.

In the manufacturing method of the array substrate provided by the present embodiment, the first source electrode and the second source electrode are electrically connected, the first drain electrode and the second drain electrode are electrically connected, the pixel electrode can be connected to at least one of the first drain electrode and the second drain electrode so that the pixel electrode can obtain an electrical signal from the first and second drain electrodes. Thus, the array substrate can improve the responding speed and charging efficiency. For example, an electrical signal can enter from the first source electrode, be spread to the second source electrode, and be transferred to the first drain electrode and the second drain electrode through the channel regions of the first active layer and the second active layer, so as to utilize a single gate electrode to control two channels, thereby avoiding a delay. Besides, because the second active layer, the second drain electrode and the second source electrode are disposed on the first active layer, the first drain electrode and the first source electrode, the array substrate does not increase the area occupied by thin film transistor switches and reduce the aperture opening ratio. Besides, because the orthographic projections of the second active layer, the second drain electrode and the second source electrode are overlapped with the orthographic projections of the first active layer, the first drain electrode, and the first source electrode, the array substrate does not increase the area occupied by thin film transistor switches and reduce the aperture opening ratio.

In a manufacturing method according to the embodiments of the disclosure, steps S401', S402', S403', S404', S405', S406', S407', S408', S409', S410', S411' are included. The steps S401'-S406' are the same as the steps S401-S406 which are described with reference to FIGS. 6a-6f, and these steps are not described repeatedly. The following steps S407'-S411' will be described with reference to FIGS. 7a-7e.

Figure 7A:
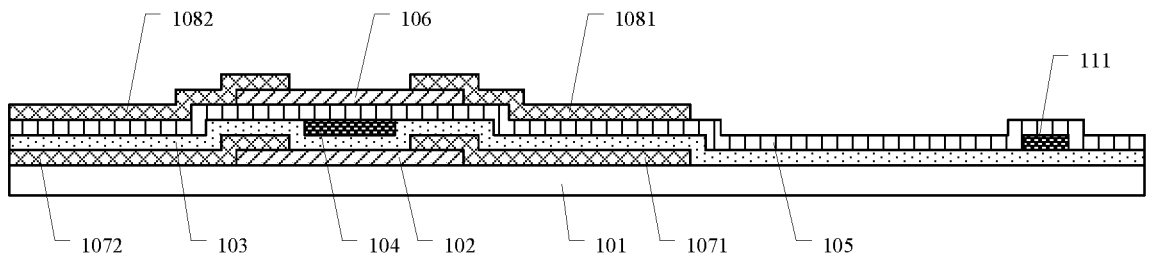
FIGS. 7a-7e are step-by-step schematic diagrams of another manufacturing method of an array substrate provided by an embodiment of the present disclosure.

Step S407', as illustrated in FIG. 7a, forming a second drain electrode 1081 and a second source electrode 1082 at a side of the second insulating layer 105 away from the gate electrode 104 to be in partial contact with the second active layer 106. This step is similar to S407, but the via holes 121 and 122 are not formed this step.

Figure 7B:
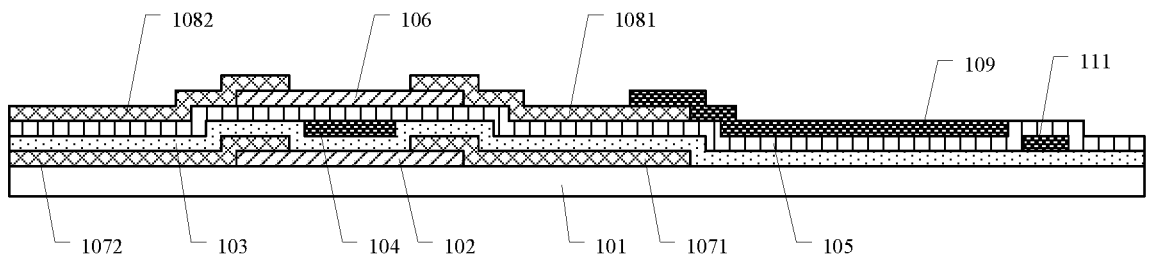

Step S408', as illustrate in FIG. 7b, forming a pixel electrode 109, the pixel electrode 109 is electrically connected with at least one of the first drain electrode and the second drain electrode. This step is similar to the step S408 as mentioned above.

Figure 7C:
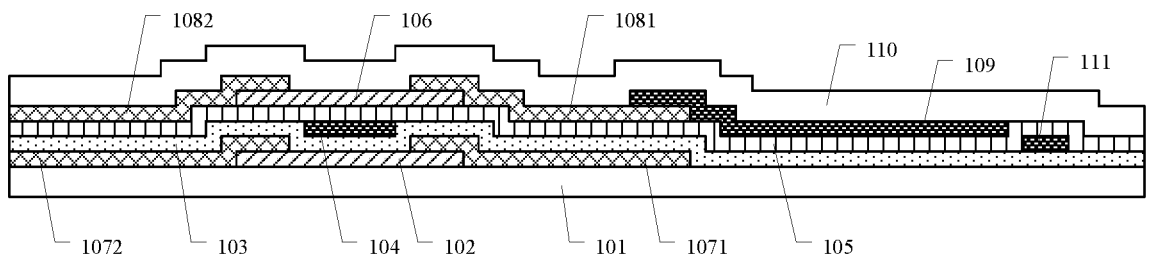

Step S409', as illustrated by FIG. 7c, forming a passivation layer 110 at a side of the second drain electrode 1081 and the second source electrode 1082 away from the second active layer 106.

Figure 7D:
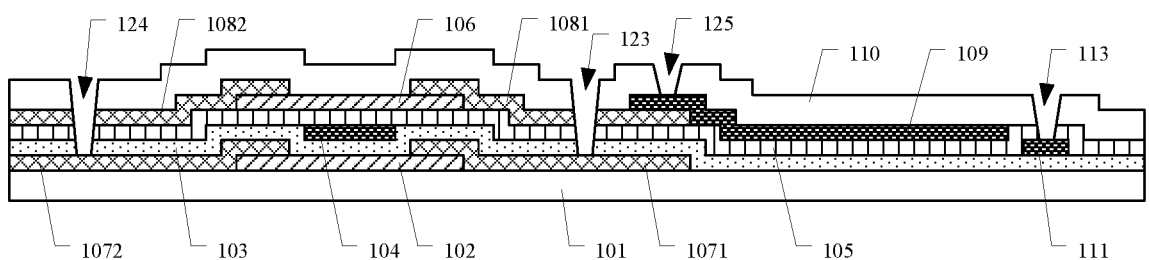
Figure 7E:
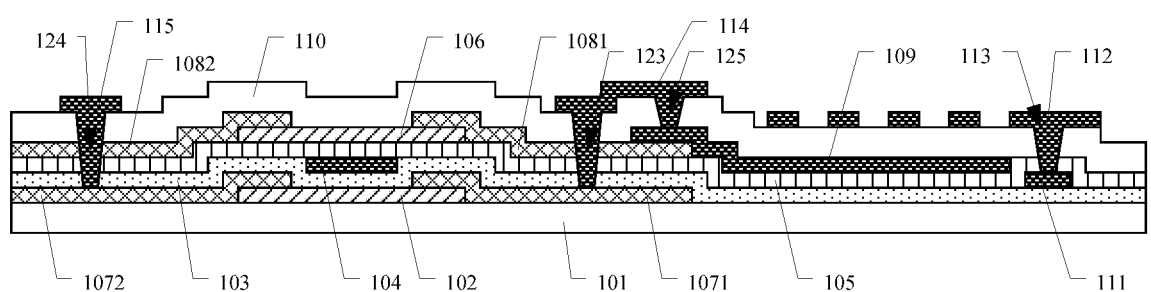

Step S410', after forming the passivation layer 110, as illustrated by FIG. 7d, forming a third via hole 123 partially exposing the first drain electrode 1071 in the first insulating layer 103, the second insulating layer 105, the second drain electrode 1081 and the passivation layer 110, and forming a fourth via hole 124 partially exposing the first source electrode 1072 in the first insulating layer 103, the second insulating layer 105, the second source electrode 1082 and the passivation layer 110. As illustrated by FIG. 7e, forming a first conductive structure 114 in the third via hole 123 to electrically connect the first drain electrode 1071 and the second drain electrode 1081; forming a second conductive structure 115 in the fourth via hole 124 to electrically connect the first source electrode 1072 and the second source electrode 1082. Thus, the first drain electrode 1071 and the second drain electrode 1081 are electrically connected through the first conductive structure 114 and the third via hole 123. It is to be noted that, the abovementioned first conductive structure 114 and the second conductive structure 115 can be formed by a same conductive layer through a patterning process, and the first source electrode 1072 and the second source electrode 1082 are electrically connected through the second conductive structure 115 and the fourth via hole 124. In addition, the embodiments of the present disclosure comprise but are not limited thereto.

For example, in the manufacturing method of the array substrate provided by an example of the present embodiment, as illustrated by FIG. 7d, the manufacturing method of the array substrate further includes forming a fifth via hole 125 partially exposing a portion of the pixel electrode 109 contacting the second drain electrode 1081 in the passivation layer 110. Thus, as illustrated by FIG. 7e, the pixel electrode 109 and the second drain electrode 1081 can be electrically connected by further disposing the first conductive structure 114 in the fifth via hole 125, so as to further improve the reliability of the electric connection between the pixel electrode and the second drain electrode. For example, the step of forming the fifth via hole and the step of forming the third via hole and the fourth via hole can be accomplished through one mask process.

The manufacturing methods to the structures as shown in FIG. 2a and FIG. 4a are described with FIGS. 6a-6l and FIGS. 7a-7e, respectively. As for the TN structures in FIGS. 2b and 4b, since the common electrode, the common electrode line and the corresponding via hole are omitted from the TN structures, the corresponding manufacturing methods for the TN structures can be obtained based on the manufacturing methods as mentioned above. For examples, the corresponding steps can be omitted or the corresponding elements can be omitted in some certain steps.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In a case of no conflict, features in one embodiment or in different embodiments can be combined.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An array substrate, comprising:
a base substrate;
a first active layer, located on the base substrate;
a first insulating layer, located on the first active layer and the base substrate;
a gate electrode, located at a side of the first insulating layer away from the first active layer;
a second insulating layer, located on the gate electrode and the first insulating layer;
a second active layer, located at a side of the second insulating layer away from the gate electrode;
a first drain electrode and a first source electrode, each being in partial contact with the first active layer;
a second drain electrode and a second source electrode, each being in partial contact with the second active layer; and
a pixel electrode,
wherein the first drain electrode and the second drain electrode are electrically connected, the first source electrode and the second source electrode are electrically connected, and the pixel electrode is electrically connected with at least one of the first drain electrode and the second drain electrode,
the array substrate further comprises:
a passivation layer, located at a side of the second drain electrode and the second source electrode away from the second active layer;
a third via hole, located in the first insulating layer, the second insulating layer, the second drain electrode, and the passivation layer and partially exposing the first drain electrode;
a first conductive structure, located in the third via hole to electrically connect the first drain electrode and the second drain electrode;
a fourth via hole, located in the first insulating layer, the second insulating layer, the second source electrode, and the passivation layer and partially exposing the first source electrode; and
a second conductive structure, located in the fourth via hole to electrically connect the first source electrode and the second source electrode.

2. The array substrate according to claim 1, wherein an orthographic projection of the gate electrode on the base substrate falls into an orthographic projection of the first active layer and the second active layer on the base substrate.

3. The array substrate according to claim 1, further comprising:
a first via hole, located in the first insulating layer and the second insulating layer and partially exposing the first drain electrode, wherein a part of the second drain electrode penetrates through the first via hole to reach the first drain electrode so that the second drain electrode and the first drain electrode are electrically connected with each other.

4. The array substrate according to claim 3, further comprising:
a second via hole, located in the first insulating layer and the second insulating layer and partially exposing the first source electrode, wherein a part of the second source electrode penetrates through the second via hole to reach the first source electrode so that the second source electrode and the first source electrode are electrically connected with each other.

5. The array substrate according to claim 4, wherein the pixel electrode is located between the second drain electrode and the passivation layer and is in partial contact with the second drain electrode.

6. The array substrate according to claim 5, further comprising:
a common electrode at a side of the passivation layer away from the base substrate; and
a common electrode line in a same layer as the gate electrode,
wherein a part of the common electrode penetrates a via hole in the passivation layer and the second insulating layer to reach the common electrode line so that the common electrode and the common electrode line are electrically connected with each other, and the common electrode and the pixel electrode are at least partially overlapped with each other in a direction perpendicular to the base substrate.

7. The array substrate according to claim 5, further comprising:
a fifth via hole, located in the passivation layer and partially exposing a portion of the pixel electrode that is in contact with the second drain electrode, wherein the first conductive structure is further located in the fifth via hole.

8. The array substrate according to claim 1, wherein the pixel electrode comprises the first conductive structure.

9. The array substrate according to claim 2, further comprising:
a first via hole, located in the first insulating layer and the second insulating layer and partially exposing the first drain electrode, wherein a part of the second drain electrode penetrates through the first via hole to reach the first drain electrode so that the second drain electrode and the first drain electrode are electrically connected with each other.

10. The array substrate according to claim 9, further comprising:
a second via hole, located in the first insulating layer and the second insulating layer and partially exposing the first source electrode, wherein a part of the second source electrode penetrates through the second via hole to reach the first source electrode so that the second source electrode and the first source electrode are electrically connected with each other.

11. The array substrate according to claim 7, further comprising:

a sixth via hole, located in the passivation layer and partially exposing the second source electrode, wherein the second conductive structure is further located in the sixth via hole.

12. A display panel, comprising the array substrate according to claim 1.

13. A display device, comprising the display panel according to claim 12.

* * * * *